(12) United States Patent
Dehkordi et al.

(10) Patent No.: US 11,585,858 B2
(45) Date of Patent: Feb. 21, 2023

(54) METHOD AND DEVICE FOR REDUCING INCORRECT MEASUREMENTS DURING THE DETERMINATION OF ELECTRICAL PARAMETERS OF ELECTRICAL COMPONENTS

(71) Applicant: Acculogic Corporation, Markham (CA)

(72) Inventors: Karim Dehkordi, Trabuco Canyon, CA (US); Daniel Marques, Markham (CA)

(73) Assignee: Acculogic Corporation, Markham (CA)

( * ) Notice: Subject to any disclaimer, the term of this patent is extended or adjusted under 35 U.S.C. 154(b) by 368 days.

(21) Appl. No.: 16/802,398

(22) Filed: Feb. 26, 2020

(65) Prior Publication Data

US 2020/0271730 A1    Aug. 27, 2020

Related U.S. Application Data

(60) Provisional application No. 62/811,042, filed on Feb. 27, 2019.

(51) Int. Cl.
*G01R 31/3835*    (2019.01)
*G01R 31/396*    (2019.01)

(52) U.S. Cl.
CPC ....... *G01R 31/3835* (2019.01); *G01R 31/396* (2019.01)

(58) Field of Classification Search
CPC .......................... G01R 31/3835; G01R 31/396
See application file for complete search history.

(56) References Cited

U.S. PATENT DOCUMENTS

| 9,625,531 | B2 | 4/2017 | Kwon et al. |
| 9,841,465 | B2* | 12/2017 | Ladret ............... G01R 31/374 |
| 2002/0145430 | A1* | 10/2002 | Arai ..................... B60K 6/485 |
| | | | 324/426 |

FOREIGN PATENT DOCUMENTS

| DE | 102007031304 A1 | 1/2009 |
| EP | 1632782 A1 | 3/2006 |

OTHER PUBLICATIONS

Office Action dated Jul. 12, 2022 for the corresponding European Patent Application No. 20 714 403.1.

* cited by examiner

*Primary Examiner* — Walter L Lindsay, Jr.
*Assistant Examiner* — Milton Gonzalez
(74) *Attorney, Agent, or Firm* — Rankin, Hill & Clark LLP

(57) ABSTRACT

Before technical components are further processed, they are checked for the functionality thereof. In this case, an incorrect judgment of the functionality can occur due to measurement errors or incorrect measurements, which in turn results in a very inefficient test. The invention provides a method and a device by which an increased measurement accuracy can be achieved. This is achieved in that at least one first electrical voltage value is measured at a first constant measurement current and at least one second electrical voltage value is measured at a second constant measurement current at terminals of the component. Every measured voltage value is scaled respectively using a profile factor PF to form a measured value M, and only measured values M that are located at least with a tolerance range in a common value range are used for the determination of an electrical parameter.

20 Claims, 2 Drawing Sheets

METHOD AND DEVICE FOR REDUCING INCORRECT MEASUREMENTS DURING THE DETERMINATION OF ELECTRICAL PARAMETERS OF ELECTRICAL COMPONENTS

CROSS-REFERENCE TO RELATED APPLICATIONS

This application claims priority to U.S. Provisional Pat. App. Ser. No. 62/811,042, filed Feb. 27, 2019.

BACKGROUND OF INVENTION

Field of Invention

The invention relates to a method for reducing incorrect measurements during the determination of electrical parameters such as an electrical resistance and/or an electrical capacitance at terminals of electrical components such as a battery. Furthermore, the invention relates to a device for carrying out a method for reducing incorrect measurements during the determination of electrical parameters at terminals of electrical components.

Brief Description of Related Art

Before technical parts or components are further processed or installed in larger devices, it is typical for them to be tested for the functionality thereof. Thus, in particular electrical parts or components are checked with respect to the electrical parameters thereof. For example, batteries are checked for the functioning thereof before they are installed into an electrical device or a vehicle. In this case, electrical parameters, for example, an electrical resistance, an inductance, a capacitance, an impedance of a resonant circuit, or the like are measured. A statement can then be made about the functionality of the component by comparison to previously determined target values or ideal values for these parameters. Further properties or variables may be computed or derived from the measured electrical variables, for example, the electrical voltage or the capacitance, so that a comprehensive test picture of the component is producible.

A high level of measurement accuracy is required in particular during the measurement of electrical resistances, inductances, or capacitances via two electrical contacts of a component. The above-mentioned electrical variables are sometimes very small. Thus, orders of magnitude of milliohms or microfarads or picofarads or nanofarads are entirely typical. In particular when carrying out a plurality of such measurements, the duration of the measurements or the measuring time is also a critical value. To be able to meet a required measuring rate, the time for the determination of the electrical properties is sometimes only a few milliseconds. Because of these low absolute values, electromagnetic interference has a devastating effect on the measurement result. The required measurement accuracy for the determination of the electrical properties of electrical components is often greater than 90% or is nearly 100%. As soon as the component or the terminals or also the measuring device are subjected to electric noise, the required measurement accuracy moves out of reach. It can thus certainly occur that a component which actually fulfills all requirements for the electrical properties nonetheless does not meet the requirements, since the measurement as such is corrupted by systematic or random noise and/or electromagnetic interference.

In large industrial plants in particular, where a variety of different drives, robots, and other devices interact, a high level of systematic and random electric noise exists. There are possibilities for suppressing this noise by appropriate precautions, however, such measures are often omitted in many cases for reasons of cost. In addition, there is also electromagnetic interference due to random noise in the measurement lines or measurement tips or the like. Because of this interference, an accurate and therefore reliable determination of electrical parameters of an electrical component is not possible.

The present invention is therefore based on the object of providing a method and a device for reducing incorrect measurements during the determination of electrical parameters of electrical components, by way of which an increase of the measurement accuracy can be achieved.

BRIEF SUMMARY OF THE INVENTION

A method for achieving this object comprises measuring, at terminals of electrical components, preferably of a battery, at least one, and preferably multiple, first electrical voltage values at a first constant measurement current and measuring at least one, preferably multiple, second electrical voltage values at a second constant measurement current at the terminals, wherein every measured voltage value is scaled respectively using a profile factor PF to form a measured value M and only measured values M that are located at least with a tolerance range in a common value range are used for the determination of the electrical parameter. The systematic error of the measurement can be reduced or eliminated by the measurement of multiple first and/or second electrical voltage values, whereby the reliability of the measurement result may be improved.

It can be provided that the first voltage values are measured at a first constant measurement current of 0 A and the second voltage values are measured at a second constant measurement current not equal to 0 A, preferably 1 A. The measurement of multiple voltage values at different measurement currents offers the possibility of determining electrical parameters, for example, the electrical resistance, very accurately by way of the differentiation of the two voltage values or current values, respectively. In particular the random errors and/or interference signals may be reduced by this method. A high level of measurement accuracy may be achieved by multiple repetitions of the measurement and the averaging and/or the differentiation. In addition, it is also conceivable to determine a capacitance of the component and an inductance and/or an impedance or another electrical variable or parameter.

Furthermore, it can be provided according to the invention that the first and the second measurement current are applied in succession over the identical time period, preferably in each case over half of the measurement time, at the terminal. This measurement time or this stimulation time of the component can be a few microseconds, milliseconds, or also seconds. However, it is important for the determination of the voltage differences that the first or second measurement current or the amperage, respectively, is constant for the ascertainment of the first or second voltage values, respectively.

Before the differentiation of the voltage values can be performed, it can be provided that firstly a profile factor PF is determined for each voltage value. For this purpose, it is provided that to determine the profile factor PF of a first measured voltage value, this first measured voltage value is divided by an arithmetic mean value of all first measured voltage values. To determine a profile factor PF of a second measured voltage value, this second measured voltage value is divided by an arithmetic mean value of all second measured voltage values. In this manner, a separate profile factor PF is determined for each measured voltage value. The first voltage values and the second voltage values are respectively used for the determination of the profile factors PF. A "mixing" of the voltage values does not take place.

Furthermore, it can be provided that to determine a measured value M for each measured first or second voltage value, this voltage value is divided by the respective determined profile factor PF. Therefore, for example, a first measured first voltage value is divided by its corresponding profile factor PF. A similar procedure is used with the second measured first voltage value. This method is repeated until the last measured second voltage value has also been divided by its own profile factor PF.

For the further consideration of the measured values M, only the measured values M which are in a specific range are used. For this purpose, it can be provided that a tolerance range is determined for each measured value M, wherein to determine an upper value of the tolerance range, the product of the measured value M and a tolerance factor is added to the measured value M and to determine a lower value of the tolerance range, the product of the measured value M and the tolerance factor is subtracted from the measured value M. The tolerance factors are to be determined beforehand in this case and/or are to be determinable by at least one test measurement. By way of this method, each measured value M receives an upper voltage tolerance value and a lower voltage tolerance value. The difference of the upper voltage tolerance value and the lower voltage tolerance value results in the tolerance range for the respective measured value M, in the center of which precisely this measured value M is located.

The individual measured values $M_X$ can then be plotted thereafter over an abscissa against the voltage on the ordinate. In general, the voltage values of the individual measured values M differ. For the determination of suitable values for the further determination of the electrical parameters, only the measured values M that are located with the tolerance ranges thereof in a common value range are evaluated. This common value range or overlap region is to be dimensioned in such a way that at least some measured values M are located therein. Furthermore, it can be provided that the measured values M that are located with the tolerance range thereof in the common value range are used to respectively determine an arithmetic mean value for the first and accordingly for the second measured voltage values, wherein the electrical parameter is determined from the arithmetic mean values and the first and second measurement currents. Thus, the electrical resistance of the component is determined by the differentiation of the arithmetic mean values of the selected measured values M for the first and second measured voltage values and by division of the difference of the employed amperages. In addition, it is also conceivable to determine a capacitance of the component and an inductance and/or an impedance or another electrical variable or parameter accordingly. Incorrect measurements may be reduced by such a determination of the electrical parameter. All errors which are caused by systematic or random electrical noise can be eliminated by this method. The electrical parameters thus determined thus have an extremely high degree of accuracy and are therefore very reliable.

Furthermore, it can be provided that 1 to 500, preferably 5 to 100, in particular 5 to 20 first and second voltage values are measured for each current value per millisecond. The checking and/or determination of electrical parameters on multiple batteries represents a preferred area of application of this method, in particular battery arrangements and battery modules for automobiles. A plurality of different terminals of batteries may be checked simultaneously here by a corresponding measuring method and the method described here for determining the parameters. A reliable result about the state and/or about the properties of the batteries can be achieved by this increased level of measurement accuracy.

The entire described method can be carried out fully automatically by a corresponding device. In this case the voltage measured values are measured by a corresponding measuring apparatus and the mentioned measurement currents are generated. The recorded voltage measured values are further processed accordingly directly by an evaluation program or analysis program to determine the electrical parameters.

A device for achieving the object mentioned at the outset is also disclosed and claimed.

The foregoing and other features of the invention are hereinafter more fully described below, the following description setting forth in detail certain illustrative embodiments of the invention, these being indicative, however, of but a few of the various ways in which the principles of the present invention may be employed.

BRIEF DESCRIPTION OF THE DRAWINGS

A preferred exemplary embodiment of the present invention is explained in greater detail hereafter on the basis of the drawing. In the figures.

DETAILED DESCRIPTION OF THE INVENTION

Figure 1A:
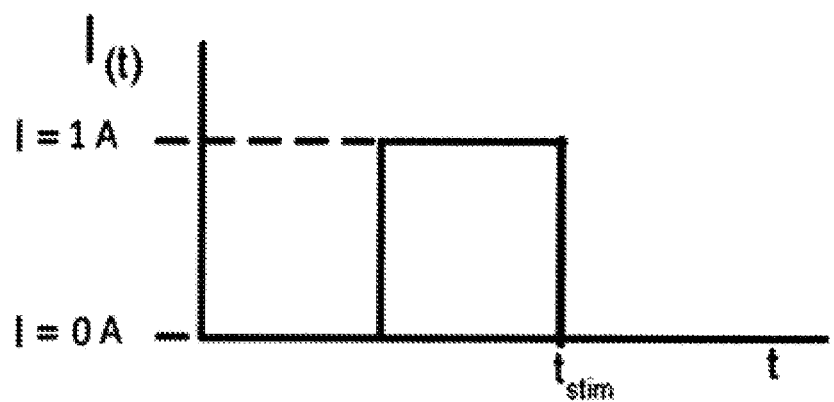
FIG. 1a shows an illustration of a time curve of a measurement current.

To be able to determine electrical parameters of an electrical component, for example, a battery, according to the invention, a constant measurement current is firstly applied at the terminals or at the corresponding contacts, respectively, of the component. For this first measurement current, a first voltage value is then measured via the terminals or contacts, respectively (FIG. 1a). The electrical resistance of the electrical component may be determined, for example, from the voltage measured value thus measured and the measurement current. However, the capacitance of the component and also the inductance and/or the impedance or another electrical variable or parameter can thus conceivably be determined at least substantially without measurement error.

To now increase the measurement accuracy of this measurement and thus generate a more reliable result, a second voltage measured value is measured at a second measurement current over the same terminals or contacts, respectively. In the measurement illustrated by way of example in FIG. 1, the ascertainment of the first voltage measured values is carried out at an amperage of 0 A and the measurement of a second voltage measured value is carried out at a second amperage of 1 A. In this case, the measurement currents are applied over an identical time period, namely each over half of the stimulation time, at the terminals.

Figure 1B:
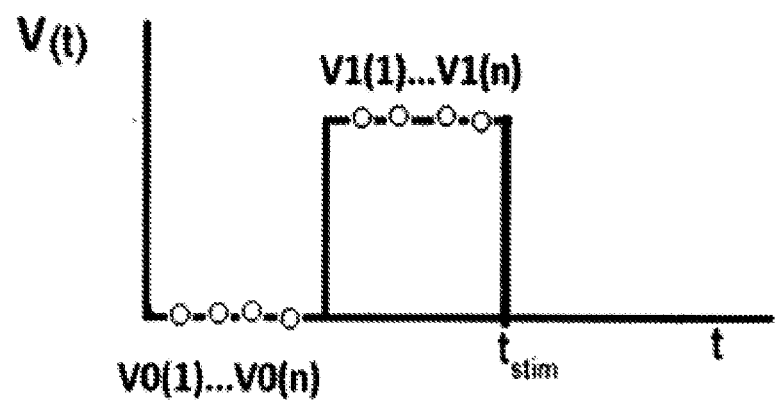
FIG. 1b shows an illustration of the first and second voltage measured values over the measuring time.

To now furthermore also minimize the influence of random electrical noise, not only one first voltage measured value and also one second voltage measured value are ascertained, but rather a plurality, preferably n measured values M. The measurement of these n measured values M is carried out, however, in each case in the constant time periods over which the current values are applied at the terminals (FIG. 1b). To now further increase the quality of the measurement results and/or minimize the influences of electromagnetic interference signals on the measurement, every measured first voltage measured value is divided by the arithmetic mean of all first voltage values. A profile factor PF is thus determined for every voltage value. These profile factors PF are determined both for the first and also for the second measured voltage values.

In a further method step, every first and second voltage value is then respectively divided by its own profile factor PF for the determination of a measured value M. These measured values M1 to M5 for the first measured voltage values are illustrated by way of example in FIG. 2. It is apparent that the measured values M1 to M5 thus ascertained, although they were measured under identical conditions, deviate significantly from one another. This deviation results from the systematic and random electrical interference signals.

Figure 2:
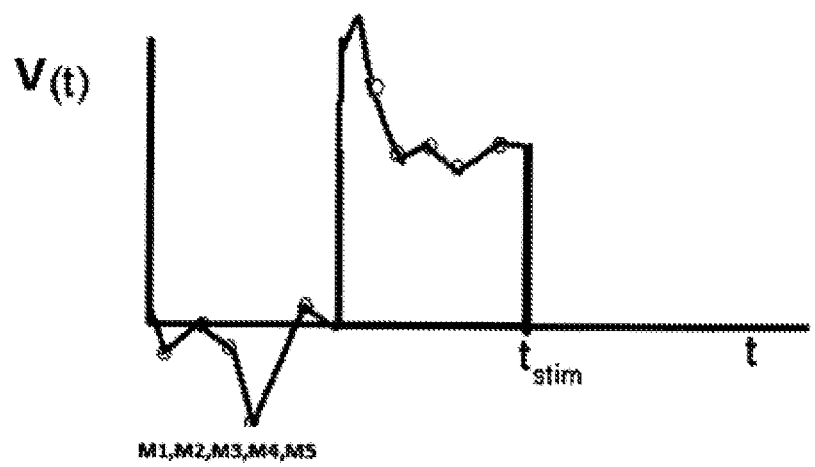
FIG. 2 shows an illustration of the voltage measured values at various points in time.
Figure 3:
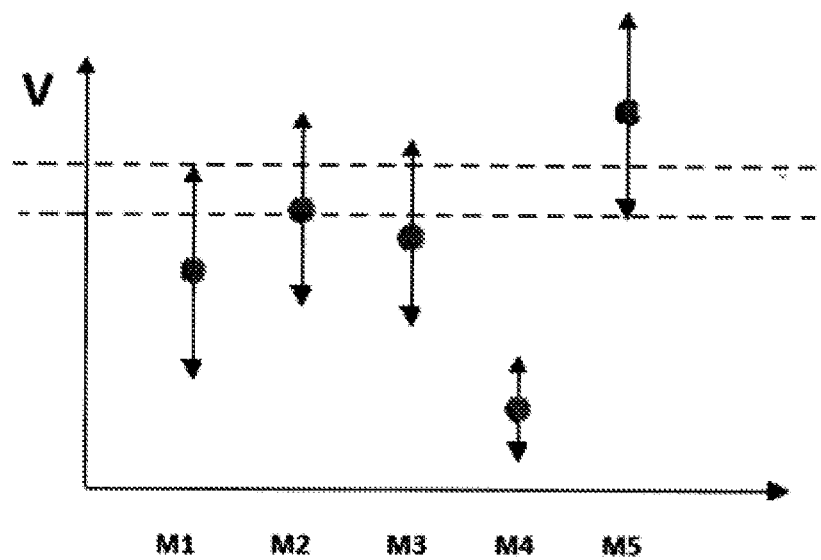
FIG. 3 shows an illustration of a relative location of the measured values in relation to a tolerance range.

For the further computation of the electrical parameters, firstly the measured values M are eliminated that do not fall in a tolerance range to be determined. For this purpose, the measured values M1 to M5 illustrated in FIG. 2 are offset using a tolerance factor. Specifically, to establish an upper tolerance value, the product of the respective measured value M1 to M5 and the tolerance factor is added to each measured value M1 to M5. A lower tolerance value for each measured value M1 to M5 is ascertained by subtraction of the product of each measured value M1 to M5 and the tolerance factor from the respective measured value M1 to M5. The upper and lower measured values thus computed are illustrated by arrows in FIG. 3.

For the judgment as to whether the measured values M are suitable for the further computation of the electrical parameters, a tolerance range is established or defined. This tolerance range is illustrated by horizontal dashed lines in FIG. 3. In the example illustrated in FIG. 3, the measured values Ml, M2, M3, and M5 fall at least partially with the measured value range thereof determined by the measured values M in the tolerance range and thus qualify as suitable for the further utilization. The measured value M4 is clearly not in the tolerance range and is therefore not considered for the further computation of the electrical parameters. An equivalent consideration and/or treatment of the measured values M is also carried out for the second voltage measured values.

For the computation of the electrical resistance, the arithmetic mean of the qualified measured values M of the first voltage values is now subtracted from the arithmetic mean of the qualified measured values M of the second voltage values. This difference of the measured values M is then divided by the difference of the current values. The value thus ascertained for the electrical resistance of the electrical component has a very high measurement accuracy which is still corrupted, if at all, only to a very limited extent by electromagnetic interference.

The influence of systematic and random error sources can be minimized by this method. It is to be expressly noted that other electrical parameters for a plurality of electrical components are also measurable and/or determinable by the same method.

Additional advantages and modifications will readily occur to those skilled in the art. Therefore, the invention in its broader aspects is not limited to the specific details and illustrative examples shown and described herein. Accordingly, various modifications may be made without departing from the spirit or scope of the general inventive concept as defined by the appended claims and their equivalents.

What is claimed is:

1. A method for reducing incorrect measurements during the determination of electrical parameters at terminals of an electrical component, the method comprising:
    measuring at least one first electrical voltage value at a first constant measurement current at the terminals; and
    measuring at least one second electrical voltage value at a second constant measurement current at the terminals;
    wherein every measured voltage value is scaled respectively using a profile factor PF to form a measured value M, and
    wherein only measured values M that are located at least with a tolerance range in a common value range are used for the determination of the electrical parameter.

2. The method according to claim 1, wherein the electrical parameters are an electrical resistance and/or an electrical capacitance.

3. The method according to claim 1, wherein the electrical component is a battery.

4. The method according to claim 1, wherein multiple first electrical voltage values are measured and/or multiple second electrical voltage values are measured.

5. The method according to claim 1, wherein the first voltage value is measured at a first measurement current of 0 A and the second voltage value is measured at a second measurement current not equal to 0 A.

6. The method according to claim 5, wherein the second measurement current is 1 A.

7. The method according to claim 1, wherein the first and the second measurement current are applied in succession over an identical time period at the terminal.

8. The method according to claim 7, wherein the first and the second measurement current are applied in succession over half of a measurement time at the terminal.

9. The method according to claim 1, wherein to determine a profile factor PF of the first measured voltage value, the first measured voltage value is divided by an arithmetic mean value of all first measured voltage values, and to determine a profile factor PF of the second measured voltage value, the second measured voltage value is divided by an arithmetic mean value of all second measured voltage values.

10. The method according to claim 1, wherein to determine the measured value M for every measured first or second voltage value, the voltage value is divided by the respective determined profile factor PF.

11. The method according to claim 1, wherein the tolerance range is determined for every measured value M, wherein to determine an upper value of the tolerance range, the product of the measured value M and a tolerance factor is added to the measured value M and, to determine a lower value of the tolerance range, the product of the measured value and the tolerance factor is subtracted from the measured value M.

12. The method according to claim 11, wherein the tolerance factors are determined by at least one test measurement.

13. The method according to claim 1, wherein the measured values M that are located with the tolerance range thereof in the common value range are used to respectively determine an arithmetic mean value for the first and second measured voltage values, and wherein the electrical parameter is determined from the arithmetic mean values and the first and second measurement current.

14. The method according to claim 13, wherein the electrical parameter is an electrical resistance, a capacitance, an inductance, or an impedance of a resonant circuit.

15. The method according to claim 1, wherein 1 to 500 first and second voltage values are measured for each current value per millisecond.

16. The method according to claim 1, wherein 5 to 100 first and second voltage values are measured for each current value per millisecond.

17. The method according to claim 1, wherein 5 to 20 first and second voltage values are measured for each current value per millisecond.

18. The method according to claim 1, wherein the electrical parameters are determined simultaneously at multiple batteries.

19. The method according to claim 18, wherein the multiple batteries are battery arrangements or battery modules for automobiles.

20. A device for carrying out a method for reducing incorrect measurements during the determination of electrical parameters at terminals of electrical components according to claim 1.

* * * * *